(12) United States Patent
Tsumori et al.

(10) Patent No.: US 9,982,189 B2
(45) Date of Patent: May 29, 2018

(54) WAVELENGTH CONVERSION MEMBER AND LIGHT-EMITTING DEVICE

(71) Applicant: SHIN-ETSU CHEMICAL CO., LTD., Tokyo (JP)

(72) Inventors: Toshihiro Tsumori, Echizen (JP); Masami Kaneyoshi, Echizen (JP); Masatoshi Ishii, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 41 days.

(21) Appl. No.: 14/654,901

(22) PCT Filed: Dec. 26, 2013

(86) PCT No.: PCT/JP2013/084777
§ 371 (c)(1),
(2) Date: Jun. 23, 2015

(87) PCT Pub. No.: WO2014/104147
PCT Pub. Date: Jul. 3, 2014

(65) Prior Publication Data
US 2015/0340571 A1    Nov. 26, 2015

(30) Foreign Application Priority Data

Dec. 28, 2012   (JP) .................. 2012-287314

(51) Int. Cl.
*H01L 33/50* (2010.01)
*C09K 11/61* (2006.01)
(Continued)

(52) U.S. Cl.
CPC ............ *C09K 11/616* (2013.01); *C09K 11/02* (2013.01); *C09K 11/617* (2013.01);
(Continued)

(58) Field of Classification Search
CPC ..... H01L 33/502; H01L 33/504; C09K 11/02; C09K 11/57; C09K 11/61
See application file for complete search history.

(56) References Cited

U.S. PATENT DOCUMENTS

| 8,974,696 B2 | 3/2015 | Kaneyoshi et al. |
| 2010/0013373 A1 | 1/2010 | Hata et al. |

(Continued)

FOREIGN PATENT DOCUMENTS

| JP | 2010-45328 A | 2/2010 |
| JP | 2010-209311 A | 9/2010 |

(Continued)

OTHER PUBLICATIONS

Extended (Supplementary) European Search Report dated Jun. 1, 2016, issued in counterpart European Patent Application No. 13868903.9. (9 pages).

(Continued)

*Primary Examiner* — C Melissa Koslow
(74) *Attorney, Agent, or Firm* — Westerman, Hattori, Daniels & Adrian, LLP

(57) ABSTRACT

A wavelength conversion member which is a resin-molded article made of at least one type of thermoplastic resin selected from polyolefins, polystyrene, styrene copolymers, fluorocarbon resins, acrylic resins, nylons, polyester resins, polycarbonate resins, vinyl chloride resins, and polyether resins. The thermoplastic resin contains less than or equal to 30 mass % of a complex fluoride fluorophore represented by $A_2(M_{1-x}Mn_x)F_6$ (M is at least one type of tetravalent element selected from Si, Ti, Zr, Hf, Ge, and Sn; A is at least one type of alkali metal selected from Li, Na, K, Rb, and Cs and including at least Na and/or K; and x is from 0.001 to 0.3) and having a particle diameter D50, which is the median diameter at a cumulative volume of 50% in particle size distribution, of from 2 μm to 200 μm inclusive. The complex (Continued)

fluoride fluorophore being dispersed in the thermoplasti-cresin.

14 Claims, 4 Drawing Sheets

(51) Int. Cl.
    *C09K 11/66*     (2006.01)
    *C09K 11/67*     (2006.01)
    *C09K 11/77*     (2006.01)
    *C09K 11/02*     (2006.01)

(52) U.S. Cl.
    CPC ........ C09K 11/7774 (2013.01); H01L 33/502 (2013.01); H01L 33/507 (2013.01)

(56) References Cited

U.S. PATENT DOCUMENTS

| | | | |
|---|---|---|---|
| 2010/0142189 A1* | 6/2010 | Hong | .............. C09K 11/616 362/97.3 |
| 2012/0032219 A1 | 2/2012 | Ooyabu et al. | |
| 2012/0212123 A1 | 8/2012 | Sakuta et al. | |
| 2012/0256533 A1 | 10/2012 | Seto et al. | |
| 2012/0261704 A1 | 10/2012 | Meyer et al. | |
| 2012/0267999 A1 | 10/2012 | Sakuta et al. | |
| 2012/0286646 A1 | 11/2012 | Sakuta et al. | |
| 2013/0264937 A1* | 10/2013 | Sakuta | .............. H01L 33/504 313/503 |

FOREIGN PATENT DOCUMENTS

| | | |
|---|---|---|
| JP | 2011-29497 A | 2/2011 |
| JP | 2012-038754 A | 2/2012 |
| JP | 2012-060192 A | 3/2012 |
| JP | 2012-104814 A | 5/2012 |
| JP | 2012-224536 A | 11/2012 |
| WO | 2010/095395 A1 | 8/2010 |
| WO | WO 2012050199 * | 4/2012 |

OTHER PUBLICATIONS

International Search Report dated Feb. 18, 2014 issued in corresponding application No. PCT/JP2013/084777 (2 pages).
Office Action dated Jun. 26, 2017, issued in counterpart Chinese Application 201380068227.3, with English translation. (10 pages).

* cited by examiner

PSEUDO-WHITE LIGHT

WAVELENGTH CONVERSION MEMBER AND LIGHT-EMITTING DEVICE

TECHNICAL FIELD

This invention relates to a wavelength conversion member which is used in light-emitting devices using blue light-emitting diodes (LEDs) such as general purpose illuminating devices, backlight sources and headlight sources, for modifying the chromaticity of illuminating light, and a light-emitting device comprising the wavelength conversion member.

BACKGROUND ART

Light-emitting diodes (LEDs) belong to a class of the most efficient light sources among currently available light sources. In particular, white LEDs find a rapidly expanding share in the market as the next-generation light source to replace incandescent lamps, fluorescent lamps, cold cathode fluorescent lamps (CCFL) for backlight, and halogen lamps. As one configuration for white LED, a white LED device (LED illuminator) constructed by combining a blue light-emitting diode (blue LED) with a phosphor capable of emitting light of longer wavelength, for example, yellow or green light upon blue light excitation is implemented on a commercial basis.

The mainstream of the white LED structure is a system in which a phosphor in admixture with resin or glass is placed on or near a blue LED so that the phosphor layer substantially integrated with the blue LED may convert the wavelength of part or all of blue light to produce pseudo-white light, to be called white LED element system. Also some light-emitting devices are based on a system in which a phosphor is spaced apart from a blue LED by a distance of several millimeters to several tens of millimeters so that the phosphor may cause wavelength conversion to part or all of blue light.

Particularly when the phosphor tends to degrade its properties by the heat generated by LED, the far distance of phosphor from the LED is effective for improving the efficiency of light-emitting device and suppressing the variation of color tone. A phosphor-containing wavelength conversion member to be spaced apart from an LED light source is known as remote phosphor plate, and such a light emitting system is known as "remote phosphor technology." Recently is active efforts are made on the light emitting system of remote phosphor technology because an improvement in overall color variation and other improvements are advantageous when the system is used for illumination.

The light-emitting device of remote phosphor technology is generally constructed, for example, by placing a wavelength conversion member, which is made of resin or glass having yellow light-emitting phosphor particles, green phosphor particles or red phosphor particles dispersed therein, forward of a blue LED as the remote phosphor, to provide a light emitting device adapted to produce white light. Examples of the phosphor used as the remote phosphor include $Y_5Al_5O_{12}$:Ce, (Y,Gd) (Al, Ga)$_5O_{12}$:Ce, (Y,Gd)$_3$Al$_5O_{12}$:Ce, Tb$_3$Al$_5O_{12}$:Ce, (Sr, Ca, Ba)$_2$SiO$_4$:Eu, and β-SiAlON:Eu. Sometimes, CaAlSiN$_3$:Eu$^{2+}$, Sr—CaAlSiN$_3$:Eu$^{2+}$ and the like are used as the red phosphor for improving the color rendering of illuminators.

Of the aforementioned phosphors suited for LED illuminators, many examples of the green or yellow light-emitting phosphor are known, but known examples of the red light-emitting phosphor are not so many, such as nitride phosphors CaAlSiN$_3$:Eu (CASN) and (Sr, Ca)AlSiN$_3$:Eu (S-CASN) and oxynitride phosphors called □-SiAlON phosphor. Since these red light-emitting phosphors must generally be synthesized at high temperature and high pressure, a special equipment resistant to high temperature and high pressure is necessary for their mass-scale synthesis.

In the past, the inventors studied in JP-A 2012-224536 (Patent Document 1) a method for the synthesis of a red phosphor having the formula (1):

$$A_2(M_{1-x}Mn_x)F_6 \tag{1}$$

wherein M is one or more tetravalent elements selected from among Si, Ti, Zr, Hf, Ge, and Sn, A is one or more alkali metals selected from among Li, Na, K, Rb, and Cs and contains at least Na and/or K, and x is a number of 0.001 to 0.3, the red phosphor being promising as LED-compatible phosphor. With the synthesis method the inventors developed, the synthesis of the phosphor can be carried out at a low temperature of up to 100° C. and atmospheric pressure, and a phosphor having a satisfactory particle size and quantum efficiency is obtained. The phosphor, however, is still insufficient in durability at high humidity.

CITATION LIST

Patent Document

Patent Document 1: JP-A 2012-224536

SUMMARY OF INVENTION

Technical Problem

An object of the invention, which has been made under the above-mentioned circumstances, is to provide a wavelength conversion member comprising a red phosphor and suited for use with LEDs, and a light-emitting device comprising the wavelength conversion member.

Solution to Problem

Focusing on a resin phosphor plate made of a mixture of a thermoplastic resin and a phosphor as a new wavelength conversion member, the inventors studied the mixing method, mixing amount, thickness of phosphor plate and arrangement of phosphor plate in LED device. In order to improve the color reproducibility of LED device, the inventors studied manganese-activated complex fluoride phosphor as the red phosphor capable of complementing light-emitting properties of a yellow phosphor in a pseudo-white LED device. Making intensive efforts, the inventors have found that humidity resistance is improved when a wavelength conversion member is constructed by dispersing a red phosphor of manganese-activated complex fluoride in a specific thermoplastic resin, and molding the resin; and that the color reproducibility of LED device is improved when the wavelength conversion member is disposed on an optical axis of a LED light source, for example, when a wavelength conversion member which is constructed by dispersing a red phosphor of manganese-activated complex fluoride in a specific thermoplastic resin and molding the resin, is disposed independent of a yellow or green wavelength conversion member, specifically forward or backward of the yellow or green wavelength conversion member. The invention is predicated on these findings.

Accordingly, the invention provides a wavelength conversion member and a light-emitting device as defined below.

[1] A wavelength conversion member which is a molded resin material comprising a thermoplastic resin and a complex fluoride phosphor dispersed therein, wherein the thermoplastic resin is one or two or more of resins selected from the group consisting of a polyolefin, polystyrene, styrene copolymer, fluoro-resin, acrylic resin, nylon, polyester resin, polycarbonate resin, vinyl chloride resin, and polyether resin, the complex fluoride phosphor is represented by the formula (1):

$$A_2(M_{1-x}Mn_x)F_6 \qquad (1)$$

wherein M is one or two or more of tetravalent elements selected from Si, Ti, Zr, Hf, Ge, and Sn, A is one or two or more of alkali metals selected from Li, Na, K, Rb, and Cs and containing at least Na and/or K, and x is a number of 0.001 to 0.3 and has a volume basis 50% cumulative particle diameter D50 in particle size distribution of 2 to 200 □m, and the complex fluoride phosphor is dispersed in the thermoplastic resin in an amount of up to 30% by weight.

[2] The wavelength conversion member of [1] wherein the complex fluoride phosphor is manganese-activated potassium silicofluoride of the formula: $K_2(Si_{1-x}Mn_x)F_6$ wherein x is as defined above.

[3] The wavelength conversion member of [1] or [2] wherein the thermoplastic resin comprises polypropylene and/or polystyrene.

[4] The wavelength conversion member of [1] or [2] wherein the thermoplastic resin comprises at least 40% by weight of polypropylene and/or polystyrene.

[5] A light-emitting device comprising a blue or pseudo-white LED light source capable of emitting light containing a blue light component having a wavelength of 420 to 490 nm, and having an optical axis, and the wavelength conversion member of any one of [1] to [4], disposed on the optical axis.

[6] A light-emitting device comprising an LED light source capable of emitting blue light and having an optical axis, the wavelength conversion member of any one of [1] to [4], disposed on the optical axis, and another wavelength conversion member on the optical axis of the LED light source comprising a phosphor capable of absorbing the blue light and emitting light having a different wavelength from the complex fluoride phosphor.

Advantageous Effects of Invention

The invention provides a novel wavelength conversion member since the wavelength conversion member is constructed by uniformly milling a predetermined amount of manganese-activated complex fluoride particles in a thermoplastic resin and molding the resin. Since the use of the wavelength conversion member in a light-emitting device or illuminator endows it with a sharp light emission peak attributable to $Mn^{4+}$ in the wavelength region of 600 to 660 nm, the color rendering of LED illumination is significantly improved.

DESCRIPTION OF EMBODIMENTS

[Wavelength Conversion Member]

Figure 1:
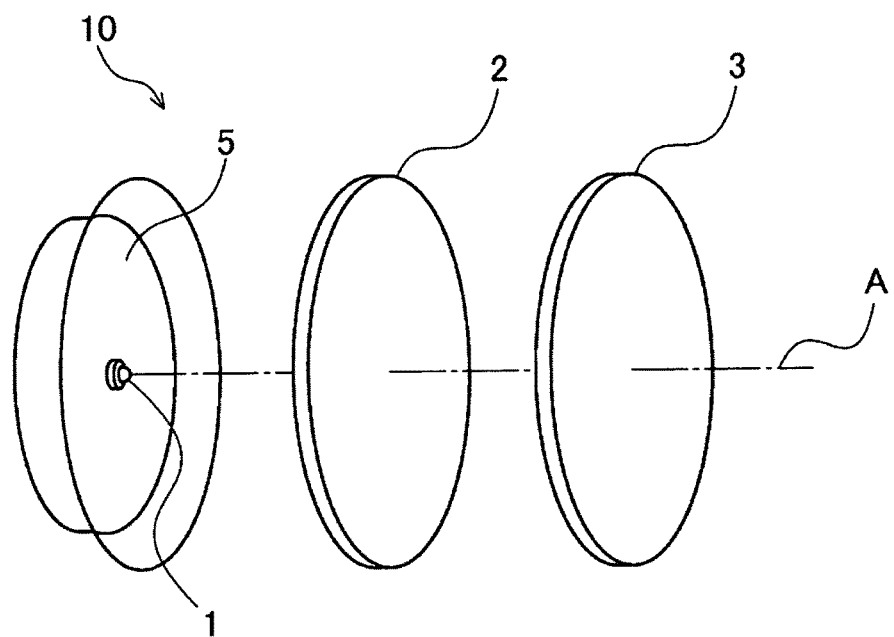
FIG. 1 is a schematic perspective view showing components of a light-emitting device according to a first embodiment of the invention.

The wavelength conversion member of the invention is described below.

The wavelength conversion member of the invention is a molded resin material comprising up to 30% by weight of a specific complex fluoride phosphor dispersed in one or more thermoplastic resins selected from the group consisting of a polyolefin, polystyrene, styrene copolymer, fluoro-resin, acrylic resin, nylon, polyester resin, polycarbonate resin, vinyl chloride resin, and polyether resin.

The complex fluoride phosphor used herein is a red phosphor having the formula (1):

$$A_2(M_{1-x}Mn_x)F_6 \qquad (1)$$

wherein M is one or more tetravalent elements selected from among Si, Ti, Zr, Hf, Ge, and Sn, A is one or more alkali metals selected from among Li, Na, K, Rb, and Cs and containing at least Na and/or K, and x is a number of 0.001 to 0.3, preferably 0.001 to 0.1.

The phosphor is a manganese-activated complex fluoride phosphor having the structure of complex fluoride $A_2MF_6$ in which part of constituent element is replaced by manganese. In the Mn-activated complex fluoride phosphor, preferably the activator Mn is a replacement at the site of tetravalent element in $A_2MF_6$, as tetravalent manganese ($Mn^{4+}$), though the replacement site is not limited thereto. In this sense, the phosphor may also be expressed as $A_2MF_6:Mn^{4+}$. Of these, the most preferred complex fluoride phosphor is manganese-activated potassium silicofluoride of the formula: $K_2(Si_{1-x}Mn_x)F_6$ wherein x is as defined above.

The manganese-activated complex fluoride phosphor emits red light having an emission peak or maximum emission peak in the wavelength range of 600 to 660 nm, when excited by blue light of wavelength 420 to 490 nm, preferably 440 to 470 nm.

It is noted that the complex fluoride phosphor of formula (1) used herein may be one produced by a prior art well-known method, for example, by dissolving or dispersing a metal fluoride starting material in hydrofluoric acid, and heating the solution for evaporation to dryness.

The manganese-activated complex fluoride phosphor should have a particle size of 2 μm to 200 μm, preferably 10 μm to 60 μm, expressed as a volume basis 50% cumulative particle diameter D50 in particle size distribution. If the particle size D50 is less than 2 μm, the phosphor has a low emission efficiency. If phosphor particles are coarse, non-uniform phosphor distribution and other drawbacks are likely to occur during mixing with the thermoplastic resin although the emission is free of essential problems. The phosphor with a particle size D50 of up to 200 µm has the advantage of convenient use.

For the measurement of particle size in the practice of the invention, a dry laser diffraction scattering method of spraying a test powder in air or dispersing a test powder suspended in air, irradiating laser light thereto, and determining a particle diameter from the diffraction pattern is preferable since the measurement is not affected by humidity and even a particle size distribution can be evaluated.

The content of the manganese-activated complex fluoride phosphor in the wavelength conversion member of the invention is preferably at least 0.1%, more preferably at least 2%, even more preferably at least 3%, and most preferably at least 5% by weight, and preferably up to 30%, more preferably up to 15%, even more preferably up to 12%, and most preferably up to 10% by weight although the content varies with the thickness of the conversion member and the desired color reproducibility.

If the phosphor content exceeds 30 wt %, there occur more friction and wear between phosphor particles and the milling screw of a molding machine during milling, and as a result, the resin-bonded phosphor or wavelength conversion member can be discolored. If the content is extremely high, phosphor particles partially agglomerate in the bonding resin, resulting in a resin-bonded phosphor member having non-uniform emission distribution. On the other hand, a phosphor content of less than 2 wt % may result in emission of less red light, losing a color rendering improving effect, although a phosphor content of less than 2 wt % is not always unacceptable. A phosphor content of at least 2 wt % is desired in order to obtain a significant color rendering improving effect.

In search for the resin used herein for bonding or encapsulating phosphor particles, the inventors paid attention to the thermoplastic resin which is chemically resistant to alkalis and fully proof to humidity, and precisely examined its molding temperature as well as its light transmittance, humidity resistance and heat resistance (in practical environment).

Using various thermoplastic resins, an attempt was made to produce resin-bonded phosphor members or wavelength conversion members to examine whether or not mixing of manganese-activated complex fluoride phosphor is possible, optical properties, and humidity resistance. It has been found that when a polyolefin, polystyrene or styrene copolymer, specifically polypropylene and/or polystyrene, more specifically polypropylene is used as the thermoplastic resin, the resin can be mixed with the phosphor, and the resin and the phosphor are little decomposed or degraded. Further studies were made on fluoro-resins, acrylic resins, nylon or polyamide resins, polyester resins, polycarbonate resins, vinyl chloride resins, and polyether resins. It has been found that these resins can be used as wavelength conversion members.

Accordingly, examples of the light transmitting thermoplastic resin used herein include polyolefins such as polyethylene and polypropylene, polystyrenes such as general purpose polystyrene (GPPS), and styrene copolymers such as styrene-maleic acid copolymers, styrene-methyl methacrylate copolymers and acrylonitrile-butadiene-styrene (ABS) copolymers as well as fluoro-resins, acrylic resins, nylons, polyester resins, polycarbonate resins, vinyl chloride resins, and polyether resins. One or more resins selected from these are used.

As the thermoplastic resin used herein, a thermoplastic resin containing at least 40% by weight of polypropylene and/or polystyrene, especially polypropylene is preferred.

The polypropylene may be a homopolymer, block copolymer or random copolymer, while the copolymer is preferably a copolymer with ethylene. A polypropylene of random copolymer type containing ethylene units in a low content of 2 to 6% by weight is especially preferred, with an injection moldable polypropylene having a melt flow rate (MFR) of 5 to 30 g/10 min. as measured according to JIS K 7210 being most preferred.

Although the molding method is not particularly limited, injection molding is preferred because molding in a short time is possible.

In the wavelength conversion member of the invention, like prior art thermoplastic resin materials, additives such as antioxidant, stabilizers including photo-stabilizer and UV absorber, and mold lubricant may be compounded in an amount of 0.1 to 0.3% by weight. Particularly on use of polypropylene, if a lowering of strength during long-term service is a problem, a heavy metal inactivating agent may be added in a limited amount of 0.3% by weight at maximum.

Furthermore, when the content (or incorporated concentration) of manganese-activated complex fluoride phosphor is low, a photo-diffusing agent may be mixed as an auxiliary agent for increasing haze to improve the diffusion of light transmitted by the member. Exemplary photo-diffusing agents include powdered inorganic ceramics such as talc, aluminum oxide, silicon oxide, aluminum silicate, and yttrium oxide. Inter alia, aluminum oxide powder and silicon oxide powder are preferred because of high transparency and a minimal loss of transmitted light. The photo-diffusing agent preferably has a particle size D50 of 0.1 to 20 µm. If the particle size D50 is less than 0.1 µm or more than 20 µm, the photo-diffusing effect may be reduced. The photo-diffusing agent is preferably added in an amount of 0.05 to 0.5%, more preferably 0.05 to 1.5%, and even more preferably 0.1 to 0.5% by weight. A content of less than 0.05 wt % may provide an insufficient photo-diffusing effect whereas a content in excess of 5 wt % may detract from the light transmittance of the wavelength conversion member.

A typical process of molding the wavelength conversion member involves furnishing the thermoplastic resin, manganese-activated complex fluoride phosphor and auxiliary agents as raw material, milling them on a mixer, and heat molding the material into any desired shape for a particular application. For example, in the milling step, the material may be directly molded into the desired shape suitable as a wavelength conversion member in a light-emitting device. Alternatively, once the material is molded into pellets, the pelleted material may be molded into a wavelength conversion member of the desired shape when necessary.

The average thickness of the wavelength conversion member is determined relative to the content of manganese-activated complex fluoride phosphor and in accordance with the required wavelength conversion performance (the quantity of light in the red wavelength region emitted on absorption of a quantity of incident blue excitation light, the transmittance of blue excitation light, and the like), with the preferred thickness being in a range of 0.5 to 5 mm, for example.

The wavelength conversion member thus obtained is a resin molding, which is substantially improved in humidity resistance because the manganese-activated complex fluoride phosphor is encapsulated with the specific thermoplastic resin. The wavelength conversion member optically produces fluorescence in the red wavelength region of wavelength about 600 to 660 nm when excited by blue light of wavelength 420 to 490 nm. When the wavelength conversion member containing the specific manganese-activated complex fluoride phosphor is applied to a light-emitting device, the red wavelength component is readily added to the emission spectrum of the device, from which improvements in color rendering of the light-emitting device, especially average color rendering index Ra and special color rendering index ΔR9 are expectable. Further, since the manganese-activated complex fluoride phosphor has a relatively low absorption coefficient of blue light of wavelength 420 to 490 nm, the wavelength conversion member has the feature that blue light readily reaches the interior of the wavelength conversion member. Accordingly, unlike the case where only a portion of the wavelength conversion member which receives blue light emits light, the wavelength conversion member emits light over its entirety. That is, the wavelength conversion member becomes a light emitting source over a wide range corresponding to the shape and dimensions of the member, which is advantageous in a light-emitting device of surface emission type.

[Light-Emitting Device]

Next, the light-emitting device of the invention is described.

FIG. 1 is a perspective view showing components of a light-emitting device according to a first embodiment of the invention.

The light-emitting device of the invention is depicted at 10 in FIG. 1 as comprising an LED light source 1 capable of emitting blue light, a wavelength conversion member (specifically red wavelength conversion member) 3 containing the inventive complex fluoride phosphor defined above, and another wavelength conversion member (e.g., yellow or green wavelength conversion member) 2 containing a phosphor capable of emitting light of different wavelength from the inventive complex fluoride phosphor upon absorption of blue light, both disposed on the optical axis A of the light source 1.

The LED light source 1 should contain light emissions capable of exciting the phosphors in all the wavelength conversion members 2 and 3 disposed in the light-emitting device 10. It should preferably emit blue light, for example, blue light of emission wavelength about 420 to 490 nm, or light containing the blue light component. The LED light source 1 is preferably composed of a plurality of LED chips for providing LED illumination.

The chromaticity of light emission from the light-emitting device 10 may be adjusted in terms of the thickness and phosphor content of wavelength conversion members 2 and 3 as well as their position on the optical axis of the LED light source 1.

Reference is made to the embodiment shown in FIG. 1 and adapted to produce white light of high color rendering wherein the other wavelength conversion member 2 and the inventive wavelength conversion member 3 are arranged on the optical axis of the LED light source 1 as viewed from the LED light source 1 side.

The other wavelength conversion member 2 is a molded resin material having a yellow or green phosphor dispersed therein. It is preferably a yellow or green wavelength conversion member in which a phosphor such as $Y_3Al_5O_{12}$:$Ce^{3+}$, $(Y,Gd)_3(Al,Ga)_5O_{12}$:$Ce^{3+}$, $(Y,Gd)_3Al_5O_{12}$:$Ce^{3+}$, $(Sr,Ca,Ba)_2SiO_4$:$Eu^{2+}$, or β-SiAlON:$Eu^{2+}$ is incorporated in a thermoplastic resin.

The content of the phosphor in the other wavelength conversion member 2 is determined in consideration of the quantity of incident blue light, the quantity of light in the yellow wavelength region, the transmittance of blue light and the like. In the case of a plate of 2 mm thick having $Y_3Al_5O_{12}$:$Ce^{3+}$ phosphor incorporated therein, for example, the incorporated concentration is preferably 0.2 to 5% by weight, more preferably 1 to 4% by weight.

The wavelength conversion member 3, which is the inventive wavelength conversion member defined above, is configured such that it may receive light from the LED light source 1 and wavelength conversion member 2 and emit light efficiently as the light emitting device. These wavelength conversion members 2 and 3 are preferably self-sustaining members which may be independently handled alone in the light-emitting device 10. The shape of wavelength conversion members 2 and 3 is not limited to a disk shape, and a curved surface shape like an incandescent bulb or any other shape is acceptable.

The wavelength conversion member 3 should preferably have a transmittance of 20 to 90%, more preferably 30 to 70% with respect to excitation light having wavelength 420 to 490 nm. If the transmittance of excitation light is less than 20%, the light emerging from the light-emitting device may be short of blue light, and its color balance may be degraded. If the transmittance exceeds 90%, the color rendering improving effect may not be expected due to shortage of red light.

The wavelength conversion member 3 is spaced a distance of preferably 2 to 100 mm, more preferably 5 to 10 mm from the LED light source 1. Although a spacing outside the range is acceptable, there is a possibility that at a spacing of less than 2 mm, the wavelength conversion member can be affected and degraded by the heat of the LED light source 1, and at a spacing in excess of 100 mm, the wavelength conversion member may become too large.

Figure 2:
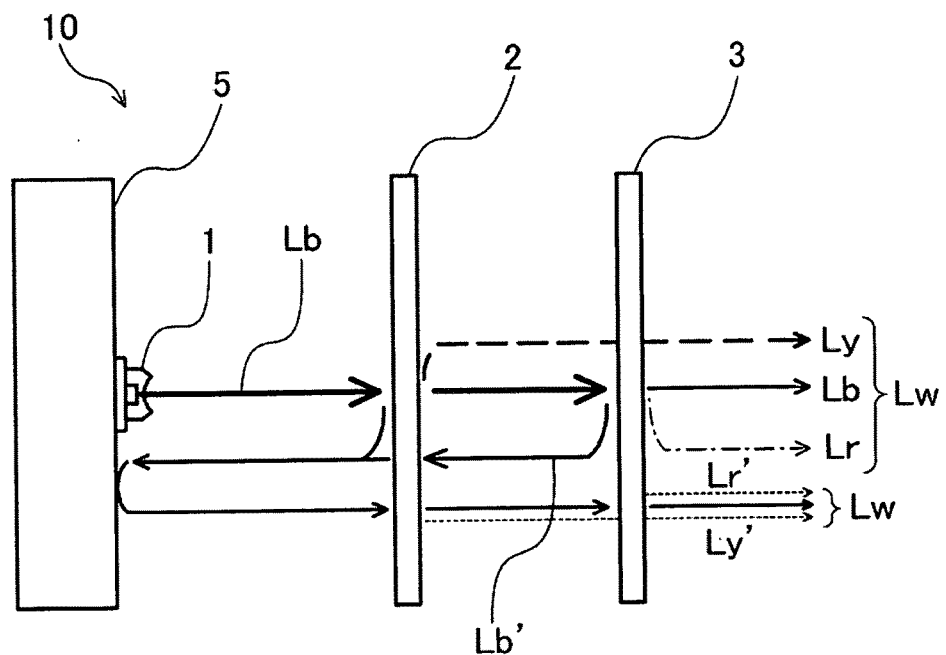
FIG. 2 is a schematic cross-sectional view illustrating light wavelength conversion modes of the light-emitting device of FIG. 1.

The light-emitting device 10 of the above-mentioned construction operates such that as shown in FIG. 2, once the LED light source 1 emits blue light Lb, the blue light Lb first enters the other wavelength conversion member 2 where a portion of blue light Lb is absorbed by the phosphor therein and converted to light (herein referred to as yellow light) Ly containing yellow wavelength region (or green wavelength region), whereupon the yellow light Ly emerges from the wavelength conversion member 2 together with the remainder of blue light Lb transmitted by the wavelength conversion member 2. Then the yellow light Ly and the remainder of blue light Lb enter the wavelength conversion member 3 where a portion of the remainder of blue light Lb is absorbed by the red phosphor therein and converted to light (herein referred to as red light) Lr containing red wavelength region, whereupon the red light Lr emerges from the wavelength conversion member 3 together with the yellow light Ly and the remainder of blue light Lb transmitted by the wavelength conversion member 3. As a result, blue light Lb, yellow light Ly and red light Lr are emitted in a predetermined ratio to produce white light Lw having high color rendering.

It is noted that when a portion of blue light Lb emitted by the LED light source 1 is reflected by the other wavelength conversion member 2 and wavelength conversion member 3, a reflector 5 is provided on the LED light source 1 side as shown in FIG. 2 so that blue light may be fed back as reflected light Lb' toward the other wavelength conversion member 2 and wavelength conversion member 3 again. Then yellow light Ly' and red light Lr' are also obtained from reflected light Lb', which contribute to the emission of white light Lw.

Since the light-emitting device 10 of the invention is constructed such that the phosphors in both the wavelength conversion members 2 and 3 are excited in sequence by the excitation light from the common LED light source 1, uniform light of consistent chromaticity is produced without a difference in emission color which is found in a light-emitting device comprising a plurality of white LED light sources, due to variations of LED outputs. Also the light-emitting device 10 of the invention offers a high freedom to the step of toning the color of light emission via simple adjustment because the wavelength conversion members 2 and 3 whose phosphor contents have been adjusted in proportion to light emission of the desired chromaticity may be mounted at the last stage of assembly of the light-emitting device 10. Notably, the light-emitting device ensures easy toning because the majority of light in the yellow wavelength region (or green wavelength region) is transmitted by the inventive wavelength conversion member 3. Further, since the wavelength conversion members 2 and 3 are spatially independent from the LED light source (light-emitting chips), it is unlikely that the members 2 and 3 are heated at high temperature, resulting in the phosphors therein keeping stable properties and a long lifetime.

Also, the arrangement sequence of wavelength conversion members 2 and 3 on the optical axis of the LED light source 1 may be altered, that is, the arrangement sequence of the inventive wavelength conversion member 3 and the other wavelength conversion member 2 from the LED light source 1 side is acceptable.

Figure 3:
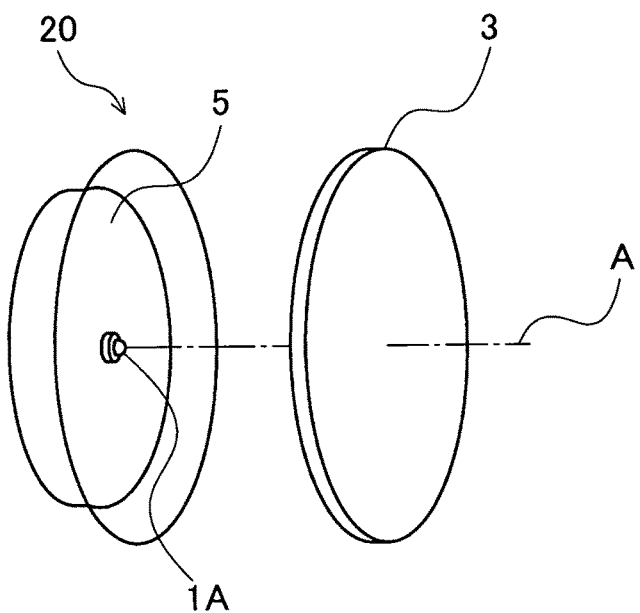
FIG. 3 is a schematic perspective view showing components of a light-emitting device according to a second embodiment of the invention.

FIG. 3 is a perspective view showing components of a light-emitting device according to a second embodiment of the invention.

The light-emitting device of the invention is depicted at 20 in FIG. 3 as comprising an LED light source 1A capable of emitting pseudo-white light containing a blue light component and the inventive wavelength conversion member 3 disposed on the optical axis A of the light source 1A.

The LED light source 1A used herein is a light source of pseudo-white light emission, for example, comprising a blue LED chip capable of emitting blue light of wavelength 420 to 490 nm, preferably 440 to 470 nm, which is surface coated with a resin coating containing a yellow or green phosphor.

The wavelength conversion member 3 and reflector 5 are the same as in the first embodiment.

The light-emitting device 20 of the above-mentioned construction operates such that once the LED light source 1A emits pseudo-white light, the pseudo-white light enters the wavelength conversion member 3 where a portion of blue light in pseudo-white light is absorbed by the red phosphor therein and converted to red light. As a result, white light having high color rendering is obtained.

Since the light-emitting device 20 of the invention is constructed such that the phosphor in the wavelength conversion member 3 is excited by a portion of pseudo-white light from the LED light source 1A serving as excitation light, uniform light of consistent chromaticity is produced without a difference in emission color which is found in a light-emitting device comprising a plurality of LED light sources, due to variations of LED outputs. Also the light-emitting device 20 of the invention offers a high freedom to the step of toning the color of light emission via simple adjustment because the wavelength conversion member 3 for red wavelength is independent of the wavelength conversion section of the LED light source 1A and because the wavelength conversion member 3 whose phosphor content has been adjusted in proportion to light emission of the desired chromaticity may be mounted at the last stage of assembly of the light-emitting device 20. Further, since the wavelength conversion member 3 is spatially independent from the LED light source (light-emitting chips), it is unlikely that the member 3 is heated at high temperature, resulting in the phosphor therein keeping stable properties and a long lifetime.

In connection with the light-emitting device of the invention, the arrangement of components may be changed as long as the spirit of the invention is not altered, and the invention is not limited to the embodiments illustrated above. For example, in the embodiment of FIG. 3 wherein the LED light source 1A is a blue LED, once the blue LED emits blue light, the blue light enters the wavelength conversion member 3 where a portion of blue light is converted into red light by the red phosphor therein whereupon a mixture of blue light and red light emerges.

The light-emitting device of the invention is suited as a light-emitting device of remote phosphor type wherein a wavelength conversion member is spaced apart from a blue LED light source by a gas or vacuum layer. Because of its light distribution characteristics distinguishable from general LED light-emitting devices, such as surface emission and a wide radiation angle, the remote phosphor system is best suited as illuminators for providing illumination over a wide area.

EXAMPLES

Examples and Comparative Examples are given below for illustrating the invention, but the invention is not limited thereto.

Example 1 and Comparative Example 1

Transparent polypropylene pellets were dried at 90° C. for 3 hours. As additives, stearyl β-(3,5-di-tert-butyl-4-hydroxyphenyl)propionate, cyclic neopentane tetraylbis(2,6-di-tert-butyl-4-methylphenyl)phosphite, bis(2,2,6,6-tetramethyl-4-piperidyl) sebacate, 2-(2'-hydroxy-3'-tert-butyl-5'-methylphenyl)-5-chlorobenzotriazole, and calcium stearate were added in an amount of 0.1 wt %, 0.1 wt %, 0.3 wt %, 0.1 wt %, and 0.05 wt %, respectively, followed by agitation and mixing.

On a twin-screw extruder, 0.5 kg of $K_2(Si_{0.97}Mn_{0.03})F_6$ phosphor having a particle size D50 of 17.6 μm was incorporated into 4.5 kg of the polypropylene pellets having additives admixed therein, yielding the polypropylene pellets loaded with 10 wt % of $K_2(Si_{0.97}Mn_{0.03})F_6$. Similarly, $K_2(Si_{0.97}Mn_{0.03})F_6$-loaded polypropylene pellets having a $K_2(Si_{0.97}Mn_{0.03})F_6$ content of 1 to 33 wt % were obtained.

Using a 20-t horizontal injection molding machine, the $K_2(Si_{0.97}Mn_{0.03})F_6$-loaded polypropylene pellets were molded into a plate-shaped member having a thickness of 2 mm and a diameter of 20 mm.

Using a quantum efficiency measuring system QE1100 (Otsuka Electronics Co., Ltd.), the plate-shaped wavelength conversion member was evaluated for a transmittance of excitation light and an external quantum efficiency of red emission resulting from wavelength conversion of excitation light. Further, the light emission from the member upon irradiation of blue light was visually observed on the back side to examine whether or not the emission was uniform. The results of evaluation are shown in Table 1.

It is evident from Examples 1-1 to 1-4 that in Example 1-1 having a low phosphor content, most light is transmitted, and light emission from the wavelength conversion member is very slight, and that as the content of red phosphor increases, the transmittance of excitation light is reduced and red light emission becomes more intense. When the light emission from the member upon irradiation of blue light was visually observed on the back side to examine the variation of limit emission, no variations were seen.

In Comparative Example 1, intense red light emission was observed, but contained variations including bright and dark spots.

TABLE 1

| | Red phosphor content (wt %) | Transmittance of excitation light (%) | External quantum efficiency of red light | Variation of light emission (as visually observed) |
|---|---|---|---|---|
| Example 1-1 | 1 | 98.7 | — | none |
| Example 1-2 | 3 | 63.1 | 0.295 | none |
| Example 1-3 | 5 | 55.4 | 0.366 | none |
| Example 1-4 | 10 | 35.8 | 0.520 | none |
| Comparative Example 1 | 33 | 5.4 | 0.710 | observed |

Example 2 and Comparative Example 2

Figure 4:
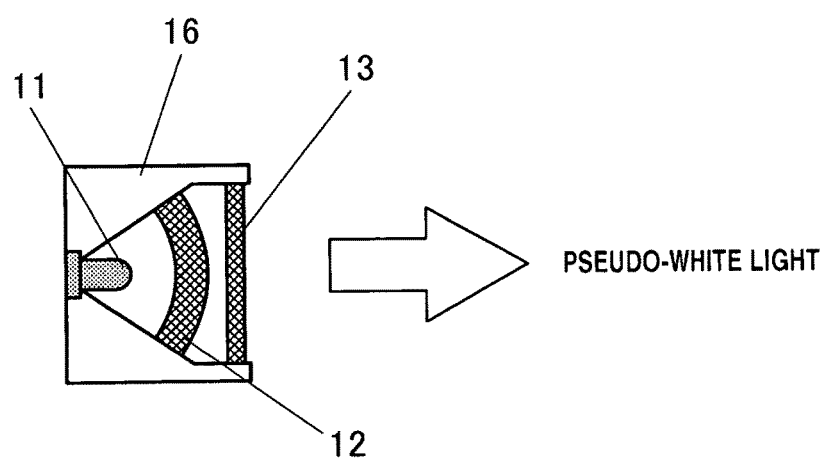
FIG. 4 is a schematic cross-sectional view showing components of a pseudo-white light-emitting LED device used for evaluation in Example 2.

As in Example 1, plate-shaped wavelength conversion members having a red phosphor content of 5 wt % and 10 wt % were prepared. Also, a similar wavelength conversion member containing 5 wt % of YAG:Ce$^{3+}$ phosphor was prepared. By combining these members, a light-emitting device of the structure shown in FIG. 4 was manufactured. Depicted in FIG. 4 are a blue LED light source 11, a yellow wavelength conversion member 12, a red wavelength conversion member 13, and a package 16. As the excitation light, a blue light source having a 2-W blue LED chip of 450 nm light emission (Cree, Inc.) was used. The combination of wavelength conversion members for each light-emitting device is shown in Table 2. Using an illuminance spectrophotometer CL-500A (Konica-Minolta Optics Co., Ltd.), the light-emitting device was evaluated for color temperature, average color rendering index Ra, and special color rendering index ΔR9. For comparison sake, a light-emitting device not using the red wavelength conversion member was manufactured and evaluated. The results are tabulated in Table 2. It is evident that the color temperature of a light-emitting device can be changed by adjusting the phosphor content and thickness of a wavelength conversion member; and that the average color rendering index Ra and special color rendering index ΔR9 are improved using the red wavelength conversion member.

Example 3 and Comparative Example 3

Light-emitting devices were manufactured under the following conditions.

Using a twin-screw extruder, $K_2(Si_{0.97}Mn_{0.03})F_6$ phosphor used in Example 1 was mixed with transparent polypropylene pellets, obtaining polypropylene pellets having a $K_2(Si_{0.97}Mn_{0.03})F_6$ phosphor concentration of 2.5 wt % and 10 wt %.

Using a 20-t horizontal injection molding machine, the $K_2(Si_{0.97}Mn_{0.03})F_6$-loaded polypropylene pellets were molded into a plate-shaped red wavelength conversion member of 2 mm thick and 100 mm squares.

Separately, pellets were prepared by incorporating 2.5 wt %, 3.0 wt %, 4.0 wt % or 5.0 wt % of $Y_3Al_5O_{12}$:Ce powder in polycarbonate resin. The pellet resin was injection molded into a plate-shaped yellow wavelength conversion member of 2 mm thick and 100 mm squares.

A white LED light-emitting device was constructed by placing two types of wavelength conversion members on an optical axis and forward of a blue LED light-emitting unit GL-RB100 (having six 2-W blue LED chips XT-E Royal Blue by Cree, Inc.) by Hino Electronic Corp. The combination of wavelength conversion members is shown in Table 3 such that the arrangement sequence of first and second wavelength conversion members from the LED light-emitting unit side may be one arrangement sequence of yellow wavelength conversion member and red wavelength conversion member or another arrangement sequence of red wavelength conversion member and yellow wavelength conversion member, while the combination of phosphor contents is changed. Also a device was constructed using the yellow wavelength conversion member (phosphor content 4 wt %) alone.

Using an illuminance spectrophotometer CL-500A (Konica-Minolta Optics Co., Ltd.), the light-emitting device was measured for color temperature, average color rendering index Ra, and special color rendering index ΔR9 at a position spaced 20 cm from the device.

As seen from Table 3, Examples 3-1 to 3-5 using the red wavelength conversion member show a higher special color rendering index ΔR9 than Comparative Example 3 not using the red wavelength conversion member.

Figure 5:
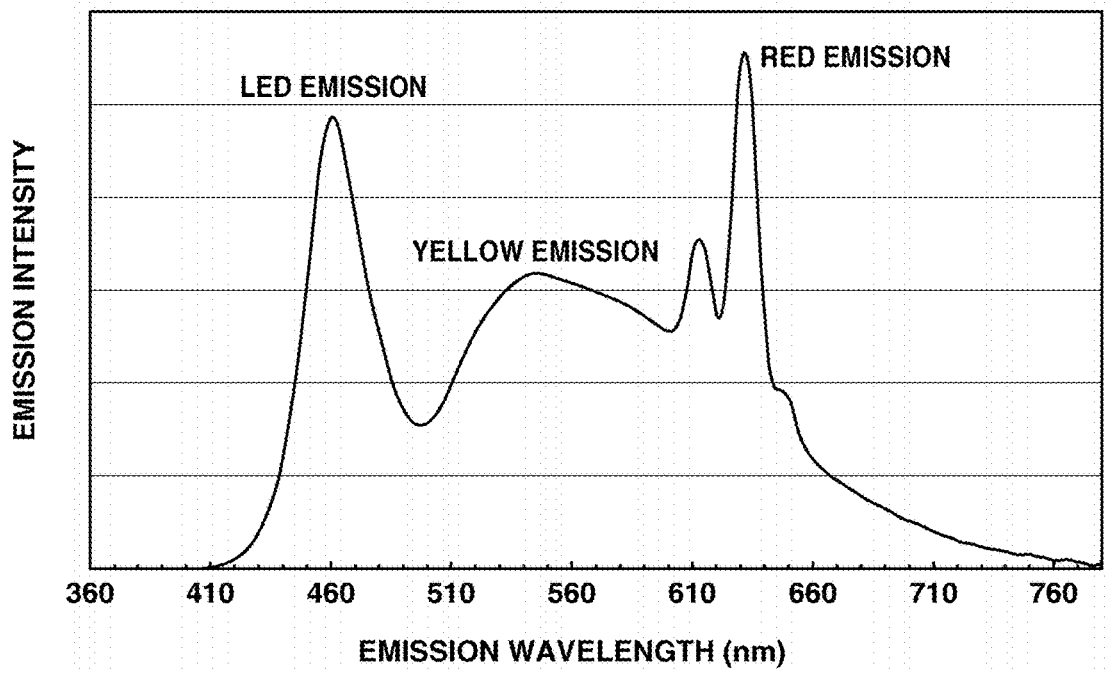
FIG. 5 is a diagram showing the emission spectrum of the light-emitting device of Example 3-2.
Figure 6:
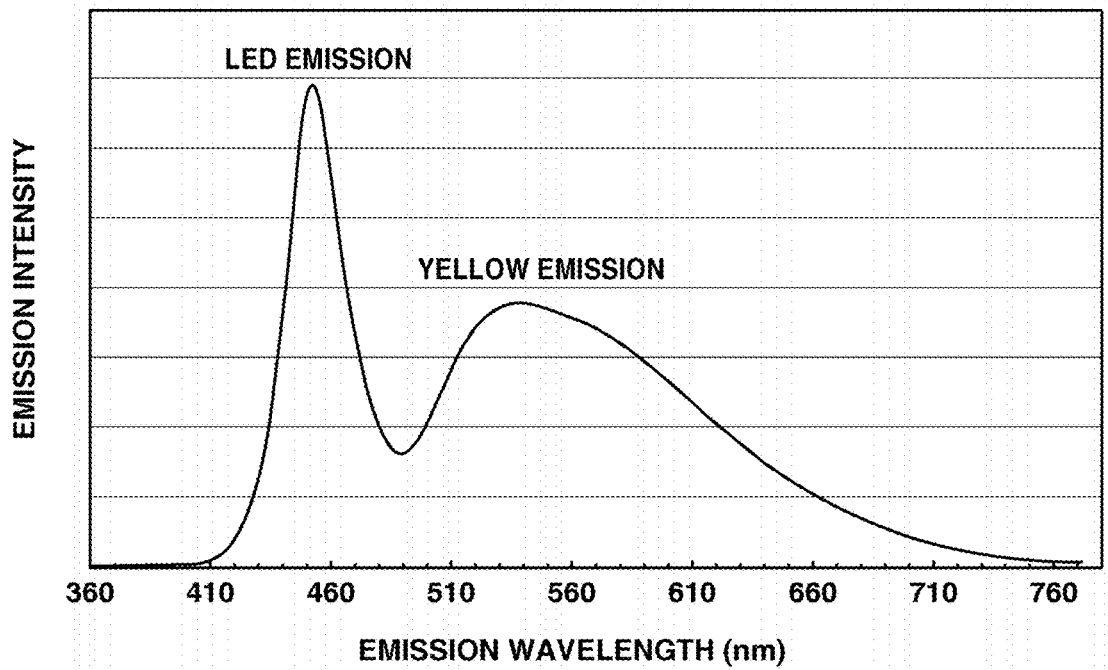
FIG. 6 is a diagram showing the emission spectrum of the light-emitting device of Comparative Example 3.

FIG. 5 shows the emission spectrum of Example 3-2, and FIG. 6 shows the emission spectrum of Comparative Example 3. A comparison between FIGS. 5 and 6 reveals that the spectrum (FIG. 5) of the light-emitting device using the inventive wavelength conversion member has an emission peak at wavelength of 600 nm or longer, which

TABLE 2

| | Yellow wavelength conversion member | | Red wavelength conversion member | | Color temperature (K) | Average color rendering index Ra | Special color rendering index ΔR9 |
|---|---|---|---|---|---|---|---|
| | YAG phosphor content | Thickness | Phosphor content | Thickness | | | |
| Example 2-1 | 5 wt % | 1 mm | 5 wt % | 2 mm | 4742 | 98 | 98 |
| Example 2-2 | 5 wt % | 1 mm | 10 wt % | 2 mm | 3208 | 92 | 90 |
| Comparative Example 2-1 | 10 wt % | 1 mm | nil | — | 4263 | 66 | −53 |
| Comparative Example 2-2 | 5 wt % | 2 mm | nil | — | 4850 | 68 | −68 | accounts for improvements in average color rendering index Ra and special color rendering index ΔR9.

TABLE 3

| | First wavelength conversion member (near LED) | | Second wavelength conversion member (remote) | | Color temperature (K) | Average color rendering index Ra | Special color rendering index ΔR9 |
|---|---|---|---|---|---|---|---|
| | Phosphor type | Phosphor content (wt %) | Phosphor type | Phosphor content (wt %) | | | |
| Example 3-1 | $Y_3Al_5O_{12}:Ce^{3+}$ | 5 | $K_2(Si_{0.97}Mn_{0.03})F_6$ | 10 | 3794 | 92 | 90 |
| Example 3-2 | $Y_3Al_5O_{12}:Ce^{3+}$ | 4 | $K_2(Si_{0.97}Mn_{0.03})F_6$ | 10 | 5895 | 90 | 92 |
| Example 3-3 | $Y_3Al_5O_{12}:Ce^{3+}$ | 3 | $K_2(Si_{0.97}Mn_{0.03})F_6$ | 10 | 14710 | 80 | 12 |
| Example 3-4 | $K_2(Si_{0.97}Mn_{0.03})F_6$ | 2.5 | $Y_3Al_5O_{12}:Ce^{3+}$ | 4 | 4547 | 80 | 90 |
| Example 3-5 | $K_2(Si_{0.97}Mn_{0.03})F_6$ | 2.5 | $Y_3Al_5O_{12}:Ce^{3+}$ | 2.5 | 5535 | 40 | 87 |
| Comparative Example 3 | $Y_3Al_5O_{12}:Ce^{3+}$ | 4 | — | — | 5435 | 73 | −59 |

It has been demonstrated that the LED light-emitting device using the inventive wavelength conversion member achieves significant improvements in average color rendering index Ra and special color rendering index ΔR9 over the LED light-emitting device using only the yellow wavelength conversion member. Even after the LED light-emitting device has been assembled, the chromaticity and color rendering of light emission can be adjusted by merely replacing the wavelength conversion member.

Figure 7A:
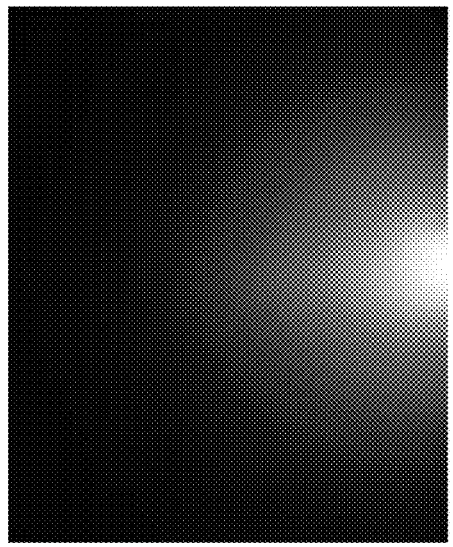
FIGS. 7A and 7B show perspective images of emissions from the wavelength conversion members of Example 3-2 and Comparative Example 3, respectively.
Figure 7B:
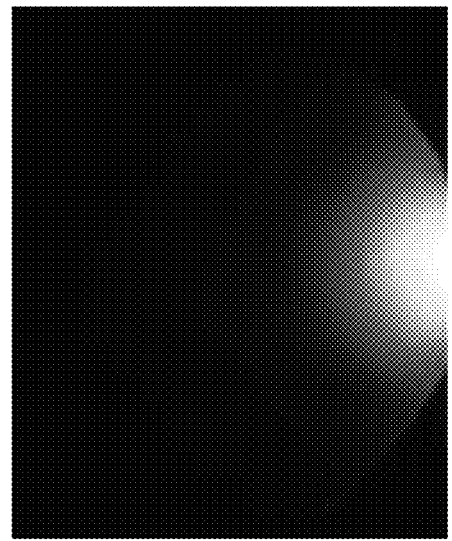

With respect to the red wavelength conversion member of Example 3-2 and the yellow wavelength conversion member of Comparative Example 3, plate-shaped wavelength conversion members of 2 mm thick and 40 mm squares were prepared using the above pellets. When light from a blue LED (wavelength 460 nm) was irradiated to the wavelength conversion member in a direction perpendicular to its 40-mm square surface, the light emission from the wavelength conversion member was visually observed from the back side. FIG. 7 is a perspective image of such light emission. In the case of the yellow wavelength conversion member of Comparative Example 3, as shown in FIG. 7(B), only the portion (right side in the figure) receiving blue light as excitation light looks bright due to light emission. In the case of the red wavelength conversion member of Example 3-2, as shown in FIG. 7(A), not only the portion receiving blue light as excitation light, but also the surrounding portion (center to left side in the figure) provide light emission, indicating that the wavelength conversion member has a wide emission range.

Although the invention has been described with reference to the embodiments illustrated in the drawing, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST 1, 1A LED light source
2 other wavelength conversion member
3, 13 red wavelength conversion member
5 reflector
10, 20 light-emitting device
11 blue LED light source
12 yellow wavelength conversion member
16 package
A optical axis
Lb blue light
Lb' reflected light
Lr, Lr' red light
Ly, Ly' yellow light
Lw pseudo-white light

The invention claimed is:

1. A wavelength conversion member which is a molded resin material comprising a thermoplastic resin and a complex fluoride phosphor dispersed therein, wherein
the thermoplastic resin is polypropylene or is a combination of polypropylene and one or more resin selected from the group consisting of a polyolefin other than polyproylene, polystyrene, styrene copolymer, fluororesin, acrylic resin, nylon, polyester resin, polycarbonate resin, vinyl chloride resin, and polyether resin,
the complex fluoride phosphor is represented by the formula (1):

$$A_2(M_{1-x}Mn_x)F_6 \quad (1)$$

wherein M is one or more of tetravalent elements selected from Si, Ti, Zr, Hf, Ge, and Sn, A is one or more of alkali metals selected from Li, Na, K, Rb, and Cs and containing at least Na and/or K, and x is a number of 0.001 to 0.3 and has a volume basis 50% cumulative particle diameter D50 in particle size distribution of 2 to 200 μm, and the complex fluoride phosphor is dispersed in the thermoplastic resin in an amount of up to 30% by weight.

2. The wavelength conversion member of claim 1 obtained by heat molding of the thermoplastic resin with the complex fluoride phosphor.

3. The wavelength conversion member of claim 1 having an average thickness of 0.5 to 5 mm.

4. The wavelength conversion member of claim 1 wherein the complex fluoride phosphor is manganese-activated potassium silicofluoride of the formula: $K_2(Si_{1-x}Mn_x)F_6$ wherein x is a number of 0.001 to 0.3.

5. The wavelength conversion member of claim 4 obtained by heat molding of the thermoplastic resin with the complex fluoride phosphor.

6. The wavelength conversion member of claim 4 having an average thickness of 0.5 to 5 mm.

7. A light-emitting device comprising
a blue or pseudo-white LED light source capable of emitting light containing a blue light component having a wavelength of 420 to 490 nm, and having an optical axis, and
the wavelength conversion member of claim 1, disposed on the optical axis.

8. A light-emitting device comprising
a blue LED light source capable of emitting light containing a blue light component having a wavelength of 420 to 490 nm, and having an optical axis,
the wavelength conversion member of claim 1, disposed on the optical axis, and
another wavelength conversion member comprising a phosphor capable of absorbing the blue light and emitting light having a different wavelength from the complex fluoride phosphor, said another wavelength conversion member being disposed on the optical axis and located between the blue LED light source and said wavelength conversion member.

9. The light-emitting device of claim 8 wherein said another wavelength conversion member contains $Y_3Al_5O_{12}$: $Ce^{3+}$ phosphor.

10. The light-emitting device of claim 8 being remote phosphor type wherein said wavelength conversion member and said another wavelength conversion member are spaced apart from the blue LED light source by a gas or vacuum layer.

11. A light-emitting device comprising
a blue or pseudo-white LED light source capable of emitting light containing a blue light component having a wavelength of 420 to 490 nm, and having an optical axis, and
the wavelength conversion member of claim 4, disposed on the optical axis.

12. A light-emitting device comprising
a blue LED light source capable of emitting light containing a blue light component having a wavelength of 420 to 490 nm, and having an optical axis,
the wavelength conversion member of claim 4, disposed on the optical axis, and
another wavelength conversion member comprising a phosphor capable of absorbing the blue light and emitting light having a different wavelength from the complex fluoride phosphor, said another wavelength conversion member being disposed on the optical axis and located between the blue LED light source and said wavelength conversion member.

13. The light-emitting device of claim 12 being remote phosphor type wherein said wavelength conversion member and said another wavelength conversion member are spaced apart from the blue LED light source by a gas or vacuum layer.

14. The light-emitting device of claim 12 wherein said another wavelength conversion member contains $Y_3Al_5O_{12}$: $Ce^{3+}$ phosphor.

* * * * *